(12) United States Patent
Rupprecht

(10) Patent No.: US 10,327,339 B2
(45) Date of Patent: Jun. 18, 2019

(54) CIRCUIT BOARD AND ARRANGEMENT WITH A CIRCUIT BOARD

(71) Applicant: ZF Friedrichshafen AG, Friedrichshafen (DE)

(72) Inventor: Stefan Rupprecht, Auerbach-Degelsdorf (DE)

(73) Assignee: ZF Friedrichshafen AG, Friedrichshafen (DE)

( * ) Notice: Subject to any disclaimer, the term of this patent is extended or adjusted under 35 U.S.C. 154(b) by 0 days.

(21) Appl. No.: 15/297,824

(22) Filed: Oct. 19, 2016

(65) Prior Publication Data

US 2017/0118847 A1    Apr. 27, 2017

(30) Foreign Application Priority Data

Oct. 22, 2015   (DE) .................. 10 2015 220 676

(51) Int. Cl.

| H05K 7/20 | (2006.01) |
|---|---|
| H05K 3/40 | (2006.01) |
| H01L 23/367 | (2006.01) |
| H01L 23/498 | (2006.01) |
| H05K 1/02 | (2006.01) |
| H05K 1/11 | (2006.01) |
| H05K 1/18 | (2006.01) |
| H05K 3/36 | (2006.01) |
| H01L 23/36 | (2006.01) |
| H05K 3/34 | (2006.01) |

(52) U.S. Cl.
CPC .......... *H05K 3/4007* (2013.01); *H01L 23/36* (2013.01); *H01L 23/367* (2013.01); *H01L 23/49838* (2013.01); *H05K 1/0203* (2013.01); *H05K 1/0204* (2013.01); *H05K 1/111* (2013.01); *H05K 1/181* (2013.01); *H05K 3/3436* (2013.01); *H05K 3/36* (2013.01); *H05K 3/3452* (2013.01); *H05K 2201/09036* (2013.01); *H05K 2201/10378* (2013.01); *Y02P 70/611* (2015.11); *Y02P 70/613* (2015.11)

(58) Field of Classification Search
None
See application file for complete search history.

(56) References Cited

U.S. PATENT DOCUMENTS 5,984,166 A * 11/1999 Holzmann ........... B23K 1/0016
                                                              118/504
7,132,744 B2 * 11/2006 Zhao .................. H01L 23/4334
                                                              257/706

(Continued)

*Primary Examiner* — Courtney L Smith
(74) *Attorney, Agent, or Firm* — Brinks Gilson & Lione

(57) ABSTRACT

The present embodiments provide a circuit board. The circuit board may comprise a first main surface, a first soldering region located on the first main surface, the first soldering region including a plurality of first capture pads for connecting the circuit board with connection pins of an integrated circuit carrier, and a second soldering region for connecting the circuit board with a heat conducting surface of the integrated circuit carrier. The first capture pads of the first soldering region may be arranged on a boundary of a rectangle or square, where the second soldering region is arranged inside the boundary, and where the second soldering region is divided into multiple second capture pads with soldering barriers formed between adjacent second capture pads.

19 Claims, 2 Drawing Sheets

(56) References Cited

U.S. PATENT DOCUMENTS

| | | | |
|---|---|---|---|
| 7,198,980 B2* | 4/2007 | Jiang | H01L 23/3128 |
| | | | 257/E23.175 |
| 7,477,523 B2* | 1/2009 | Tsuji | H01L 21/561 |
| | | | 174/262 |
| 9,468,104 B2* | 10/2016 | Kakehashi | H05K 1/144 |
| 9,591,769 B2* | 3/2017 | Mizushiro | H05K 3/3452 |
| 2007/0246818 A1* | 10/2007 | Ejima | H01L 21/563 |
| | | | 257/693 |
| 2007/0278677 A1* | 12/2007 | Ejima | H01L 23/49866 |
| | | | 257/738 |
| 2009/0072385 A1* | 3/2009 | Alley | H01L 23/38 |
| | | | 257/713 |
| 2009/0213561 A1* | 8/2009 | Mi | H01L 23/645 |
| | | | 361/782 |
| 2012/0075807 A1* | 3/2012 | Refai-Ahmed | H01L 23/13 |
| | | | 361/719 |
| 2013/0343000 A1* | 12/2013 | Shi | H01L 23/3677 |
| | | | 361/717 |
| 2015/0279820 A1* | 10/2015 | Usami | H01L 25/0657 |
| | | | 257/737 |

* cited by examiner

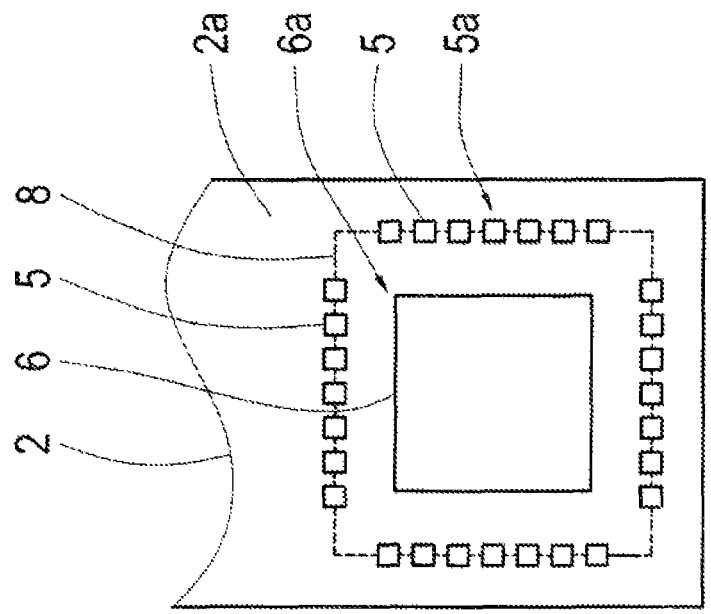
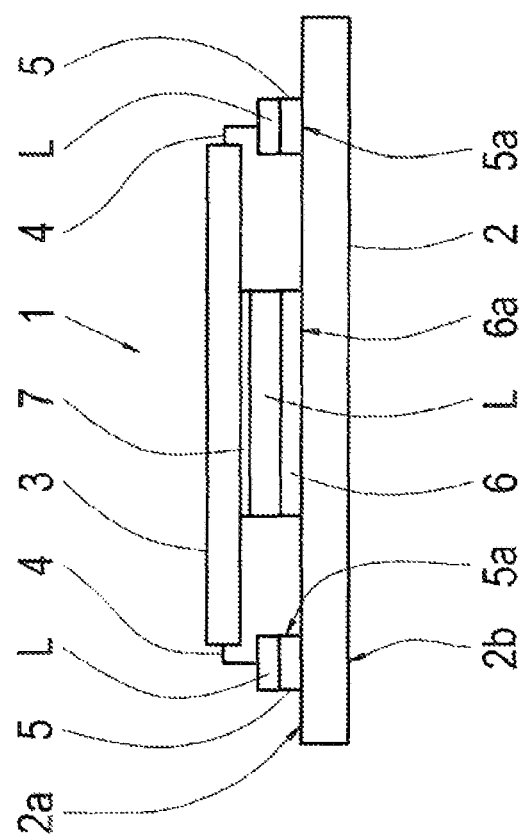

CIRCUIT BOARD AND ARRANGEMENT WITH A CIRCUIT BOARD

CROSS-REFERENCE TO RELATED APPLICATIONS

This current application claims the priority of German Patent Application DE 10 2015 220 676.9, filed on Oct. 22, 2015, which is incorporated by reference herein in its entirety.

TECHNICAL FIELD

The present disclosure relates to a circuit board and an arrangement with a circuit board.

BACKGROUND

Because of increasing installation space requirements, electronic components are permanently subject to the trend to become smaller and smaller while their functional range remains the same or is increasing. This results in an increasing power density in the component, which requires a further development of existing solutions or the use of new concepts to meet the increased thermal requirements.

In highly integrated circuits, for example, ICs (IC—integrated circuit) or SMD components, such as driver components or power modules, which result in extensive power losses and thus high heat outputs, such heat outputs have to be dissipated via solder connections with a circuit carrier, for example, a circuit board. Usually, such highly integrated circuits comprise heat conductivity surfaces, also described as exposed pads, which are arranged on a surface of the highly integrated circuit facing the circuit board. Usually, these heat conducting surfaces are soldered with appropriate soldering surfaces to the circuit board, which can result in a heat transfer from the highly integrated circuit to the circuit board.

The connection of the highly integrated circuit, for example, an SMD component, usually takes place in that soldering paste is applied to the soldering surfaces (circuit board pad or capture pad) of the circuit board. The soldering paste is applied to the circuit board pad by means of screen printing, dispenser or jet print. Then the SMD component is placed into position. Subsequently, the volatile components of the soldering paste are vaporized in the soldering process. The expanding gas bubbles are joining together and form a macro bubble in the soldering gap between circuit board and SMD component. Because of the surrounding brazing solder, excess pressure is generated in the bubble and lifts the component. As a result, it is no longer possible to solder reliably the connection pins on the sides of the SMD component. This can result in breakages or hairline cracks in the soldering connection between the connection pins and the soldering surface (circuit board pad) on the circuit board, which can result in malfunction of the entire circuit.

BRIEF DESCRIPTION OF THE DRAWINGS

Subsequently, the embodiments of the present disclosure are described in more detail by means of the figures. It is shown:

FIG. 1 shows a sectional view of an exemplary arrangement comprising a circuit board and a highly integrated circuit carrier according to prior art.

FIG. 2 shows a top view of a circuit board comprising capture pads according to prior art.

DETAILED DESCRIPTION

Figure 4:
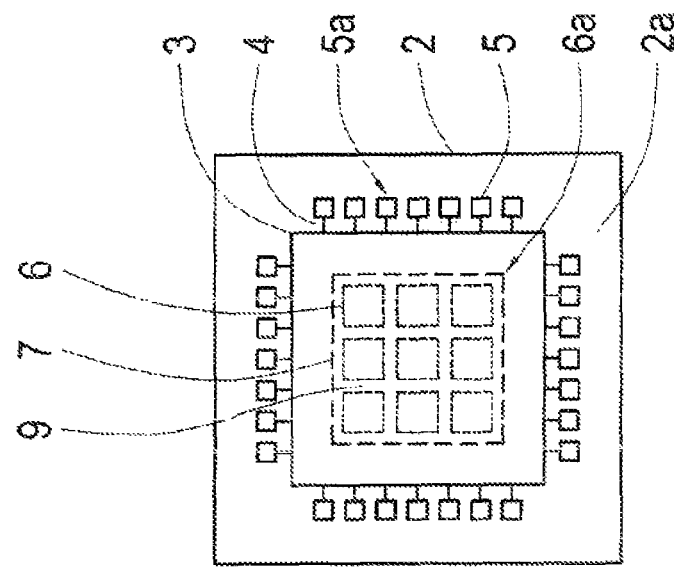
FIG. 4 shows a schematic top view of arrangement of a circuit board comprising capture pads and a highly integrated circuit carrier.

It is the objective of the present disclosure to provide a circuit board and an arrangement comprising a circuit board, which eliminates the disadvantages of prior art and which allow for a reliable soldering connection between circuit board and highly integrated circuit.

The present disclosure relates to a circuit board, which may have a first and second main surface, wherein on at least one main surface first soldering regions are provided, which have capture pads for connecting the circuit board with connection pins of a highly integrated circuit carrier, and a second soldering region for connecting the circuit board with a heat conducting surface of a highly integrated circuit carrier, wherein multiple capture pads of the first soldering regions are arranged, at least in sections, on a boundary of a rectangle or square, and the second soldering region is arranged inside the boundary. The second soldering region may be divided into multiple capture pads and soldering barriers are formed between adjacent capture pads.

The first soldering region on the circuit board may involve an area with multiple so-called capture pads for the connection pins of the highly integrated circuit carrier. In an exemplary embodiment, these connection pins are arranged along the border at the edges of the highly integrated circuit carrier and are bent in such a way that the connection pins protrude from the lower surface of the highly integrated circuit carrier. At the same time, the capture pads of the circuit board may be arranged on the circuit board in such a way that they could accept, respectively, one connection pin of the highly integrated circuit carrier.

In some embodiments, the capture pads are provided with a soldering paste, which melts during the soldering process and connects with the connection pin of the highly integrated circuit carrier, thus forming a secure electrical connection between the capture pad on the circuit board and the connection pin of the highly integrated circuit carrier.

The second soldering region on the circuit board may involve a capture pad for the heat conducting surface of the highly integrated circuit carrier. The heat conducting surface, also described as exposed pad, may be arranged on the lower surface of the highly integrated circuit carrier, i. e., on a surface of the highly integrated circuit carrier facing the circuit board. The capture pad of the second soldering region may be soldered with the heat conducting surface of the highly integrated circuit carrier. As a result, it is possible that the heat output is transferred from the highly integrated circuit carrier to the circuit board where it is transported through heat conduction management to respective cooling elements.

The second soldering region may be divided into multiple capture pads. These individual capture pads of the second soldering surface may be separated from each other by means of soldering barriers. Each capture pad of the second soldering surface may be provided with soldering paste in order to make it possible that during the soldering process each of the second capture pads is soldered with the heat conducting surface of the highly integrated circuit carrier.

As a result, it is possible to provide a secure solderability, especially a solderability according to current standards, by preventing SMD components, which comprise exposed pads or large-scale connection pins, from lifting. By means of the present disclosure, the formation of macro bubbles is prevented during the soldering process because, as a result of the structures between the individual capture pads of the second soldering region that cannot be wetted, macro gas bubbles cannot be formed. Furthermore, as a result of the geometry, there is a high percentage solder connection, thus making it possible to minimize the heat transfer resistance and the electrical resistance from the highly integrated circuit carrier to the circuit board. In addition, it is possible to solder in an even manner the capture pads of the second soldering region and to avoid hot spots resulting from macro gas bubbles. Multiple small capture pads, into which the second soldering region is divided, allow for a relatively constant printed soldering paste amount. By preventing the highly integrated circuit carriers from lifting, even brazing gaps are formed, which have appositive effect on the operating life of the soldering points. During temperature changes, uneven brazing gaps generate forces of different strength in the soldering points of a components, which result in a reduced operating life.

The geometry of the second soldering region may allow for high solder connections in the range of between 45 and 60%, which results in the fact that the highly integrated circuit carriers are better cooled and have a lower contact resistance. In addition, there is lower electrical contact resistance in the field of power electronics.

In a first embodiment of the present disclosure, the soldering barriers can be designed in the form of solder-stop webs consisting of solder-stop mask. In a second embodiment, the soldering barriers can be recesses in the circuit board, which can be, for example, milled into the circuit board. However, it is also possible to produce the recesses by cauterizing the copper layer forming the capture pad. The soldering barriers prevent brazing solder from being moved from one capture pad of the second soldering region to an adjacent capture pad of the second capture pad.

The width of the soldering barriers between adjacent capture pads of the second soldering region amounts to, for example, less than 0.8 mm. In larger widths, the connection surface between circuit board and heat conducting surface of the highly integrated circuit carriers is reduced, thus reducing the heat transport.

A capture pad of the second soldering region can comprise a square surface having measurements of between 1.2 mm by 1.2 mm and 2.0 mm by 2.0 mm. A capture pad of the second soldering region can comprise a rectangular surface, wherein the narrow side of the surface amounts to between 1.2 mm and 2.0 mm. Advantageously, in the second soldering region, the surface occupying the soldering barriers is smaller than the surface occupying the capture pads.

In exemplary embodiments, the measurement of a capture pad in the second soldering region may be less than 2.0 mm. If they are larger than 2.00 mm, larger connected gas cavities could be produced during the soldering process, because they only outgas when they are pressed against an outgassing channel (soldering barrier). The distances to these barriers become larger, the larger the measurement of the capture pad. As a result, a macro gas bubble can be produced in that multiple small gas bubbles are being joined together. In these macro gas bubbles, because of the large surface of such a capture pad of the second soldering region, the slightest excess pressure of outgassing the flux would be sufficient to lift the highly integrated circuit carrier and expand the brazing gap.

Advantageously, exactly two capture pads of the first soldering region may be situated opposite one another on the boundary. Advantageously, the individual capture pads of the first soldering region can be divided, wherein the division of an individual capture pad is performed by means of soldering barriers analogous to the above descriptions. In this connection, a divided capture pad may be associated with an individual connection pin.

A further aspect involves an electronic component, which may comprise a circuit board and an integrated circuit carrier having a heat conducting surface and connection pins, wherein the heat conducting surface of the integrated circuit carrier is soldered with the capture pads of the second soldering region of the circuit board, and each connection pin of the integrated circuit carrier is soldered with exactly one capture pad of the first soldering region of the circuit board.

FIG. 1 shows a sectional view of an exemplary arrangement having a circuit board 2 and a highly integrated circuit carrier 3 according to prior art. On the first main surface 2a, the circuit board 2 comprises first soldering regions 5a with multiple capture pads 5. On the first main surface 2a of the circuit board 2, a second soldering region 6a in the form of a capture pad 6 is applied between the capture pads 5. The capture pads 5, 6 are mounted at the same height on the soldering regions 5a, 6a. The required amount of brazing solder, controlled, among other things, with the layer thickness of the soldering paste L used, can vary between the first soldering region 5a and the second soldering region 6a. Basically, this depends on the structural tolerances, especially the standoff of the component 3 to be soldered. The term standoff describes the height difference between the lower edge of the connection pins 4 and the lower edge of the heat conducting surface 7 of the component 3. The connection pins 4 of a highly integrated circuit 3, for example an IC, are soldered with the capture pads 5 of the first soldering region 5a. At the same time, the heat conducting surface 7, also described as exposed pad, of the highly integrated circuit carrier 3 is supported by the capture pad 6 of the second soldering region 6a and is soldered with it. Because of the different heights between the lower edge of the connection pins 4 and the lower edge of the heat conducting surface 7 of the component, the used amount of brazing solder and thus the used soldering paste strength can vary on capture pad 5 or capture pad 6.

FIG. 2 shows a top view of a circuit board 2 comprising capture pads 5, 6 according to prior art. First soldering regions 5a are applied on a boundary 8 on the upper surface 2a of the circuit board 2. The first soldering regions 5a consist of multiple capture pads 5. The capture pads 5 are arranged on the boundary 8 of an imaginary rectangle or square. Advantageously, the capture pads 5 are arranged in such a way that each capture pad 5 is assigned to exactly one connection pin 4 of an IC (not shown) o be applied to the circuit board 2. The capture pad 6 of the second soldering region 6, which can be soldered with the heat conducting surface of an IC (not shown), is arranged inside of the boundary 8. Advantageously, capture pad 6 of the second soldering region 6 is arranged in such a way that it produces a large covering area of capture pad 6 and heat conducting surface (not shown) of an IC (not shown).

Furthermore, FIG. 2 shows that always two capture pads 5 of the first soldering region 5a are situated opposite from one another on the boundary 8. Advantageously, the capture pads 5 of the first soldering region 5a correspond with the connection pins 4 of the highly integrated circuit carrier 3.

Figure 3:
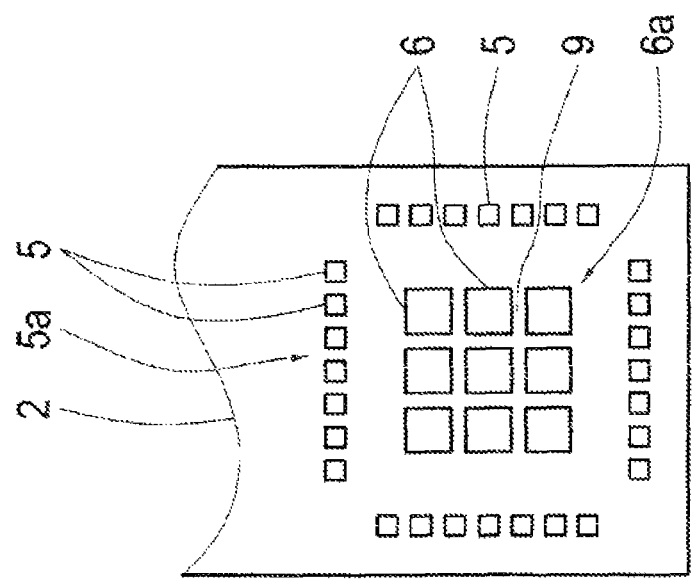
FIG. 3 shows a top view of to circuit board comprising capture pads.

FIG. 3 shows a top view of a circuit board 2 comprising capture pads 5, 6 according to the present disclosure. At the same time, the capture pads 5 of the first soldering regions 5a correspond with the capture pads 5 of the soldering regions 5a according to FIG. 2. Soldering region 6a for the heat conducting surface (not shown) of the IC (not shown) is divided in multiple capture pads 6. Soldering barriers 9 exist between the individual capture pads 6. These soldering barriers 9 can involve solder-stop paste or recesses in the circuit board 2. FIG. 3 shows the number of capture pads 6 in soldering region 6a in an exemplary manner to be 3 by 3. However, it is also possible that the capture pads 6 are arranged in an A by A or A by B matrix with A, B>3 and A≠B. Advantageously, the capture pads 6 are arranged in a matrix, which corresponds in an appropriate manner with the heat conducting surface (not shown) of the IC (not shown), which is to be connected with the circuit board 2.

FIG. 4 shows a schematic top view of an arrangement 1 of a circuit board 2 comprising capture pads 5, 6 and a highly integrated circuit carrier 3. FIG. 4 shows a circuit board 2. A highly integrated circuit carrier 3 comprising connection pins 4 is arranged on the first main surface 2a. The connection pins 4 are connected, especially soldered, with capture pads 5 on the circuit board 2. In addition, multiple capture pads 6 of the second soldering region 6a are also arranged on the first main surface 2a. These capture pads 6 are connected, especially soldered, with the heat conducting surface 7 of the highly integrated circuit carrier 3. Soldering barriers 9 in the form of solder-stop paste or recesses in the circuit board 2 exist between the capture pads 6 of the second soldering region 6a.

REFERENCE LIST 1 arrangement
2 circuit board
2a first main surface
2b second main surface
3 integrated circuit carrier
4 connection pin
5 capture pad comprising brazing solder for connection pin
5a first soldering region
6 capture pad comprising brazing solder for heat conducting surface
6a second soldering region
7 heat conducting surface (exposed pad)
8 boundary
9 soldering barrier
L soldering paste

I claim:

1. A circuit board, the circuit board comprising:
   a first main surface;
   a first soldering region located on the first main surface, the first soldering region including a plurality of first capture pads for connecting the circuit board with connection pins of an integrated circuit carrier; and
   a second soldering region for connecting the circuit board with a single and continuous heat conducting surface of the integrated circuit carrier, the second soldering region including a plurality of second capture pads for contacting the single heat conducting surface of the integrated circuit carrier, wherein each of the second capture pads is soldered directly to the single heat conducting surface; and
   a plurality of soldering barriers located adjacent to the second capture pads to isolate the second capture pads from one another,
   wherein the first capture pads of the first soldering regions are arranged on a boundary of a rectangle or square,
   wherein the second soldering region is arranged inside the boundary, and
   wherein the second capture pads are arranged in a matrix.

2. The circuit board of claim 1, wherein the soldering barriers include solder-stop paste.

3. The circuit board of claim 1, wherein only solder is located between each of the second capture pads and the single heat conducting surface.

4. The circuit board of claim 1, wherein the width of the soldering barriers between adjacent second capture pads is 0.8 mm or less.

5. The circuit board of claim 1, a wherein a second capture pad of the plurality of second capture pads comprises a square surface having a width of between 1.2 mm and 2.0 mm.

6. The circuit board of claim 1, wherein a second capture pad of the plurality of second capture pads comprises a rectangular surface, wherein the smaller of the length and the width of the rectangular surface is between 1.2 mm and 2.0 mm.

7. The circuit board of claim 1, wherein exactly two first capture pads of the first soldering region are situated opposite one another on the boundary.

8. An arrangement comprising a circuit board and an integrated circuit carrier,
   the circuit board comprising:
      a first main surface;
      a first soldering region located on the first main surface, the first soldering region including a plurality of first capture pads for connecting the circuit board with connection pins of the integrated circuit carrier; and
      a second soldering region for connecting the circuit board with a single heat conducting surface of the integrated circuit carrier,
      wherein the first capture pads of the first soldering region are arranged on a boundary of a rectangle or square,
      wherein the second soldering region is arranged inside the boundary,
      wherein the second soldering region includes a plurality of second capture pads and a plurality of soldering barriers formed between adjacent second capture pads such that adjacent second capture pads are isolated from one another, and
      wherein the second capture pads are arranged in a matrix; and
   the integrated circuit carrier comprising:
      the single heat conducting surface and a plurality of connection pins,
      wherein the single heat conducting surface of the integrated circuit carrier is soldered directly with the second capture pads of the second soldering region of the circuit board, and
      wherein each connection pin of the integrated circuit carrier is soldered with a first capture pad of the first soldering region of the circuit board.

9. The circuit board of claim 8, wherein the soldering barriers include solder-stop paste.

10. The circuit board of claim 8, wherein only solder is located between each of the second capture pads and the single heat conducting surface.

11. The circuit board of claim 8, wherein the width of the soldering barriers between adjacent second capture pads is 0.8 mm or less.

12. The circuit board of claim 8, wherein a second capture pad of the plurality of second capture pads comprises a square surface having a width of between 1.2 mm and 2.0 mm.

13. The circuit board of claim 8, wherein a second capture pad of the plurality of second capture pads comprises a rectangular surface, wherein the smaller of the length and the width of the rectangular surface is between 1.2 mm and 2.0 mm.

14. The circuit board of claim 8, wherein exactly two first capture pads of the first soldering region are situated opposite one another on the boundary.

15. A method of manufacturing a circuit board, the method comprising:
    forming a first main surface;
    forming a first soldering region located on the first main surface, the first soldering region including a plurality of first capture pads for connecting the circuit board with connection pins of an integrated circuit carrier;
    forming a second soldering region for directly connecting the circuit board with a single heat conducting surface of the integrated circuit carrier via solder, the second soldering region including a plurality of second capture pads for contacting the single heat conducting surface of the integrated circuit carrier; and
    forming a plurality of soldering barriers located adjacent to the second capture pads to isolate the second capture pads from one another,
    wherein the first capture pads of the first soldering region are arranged on a boundary of a rectangle or square,
    wherein the second soldering region is arranged inside the boundary, and
    wherein the second capture pads are arranged in a matrix.

16. The method of claim 15, wherein the soldering barriers include solder-stop paste.

17. The method of claim 15, wherein the width of the soldering barriers between adjacent second capture pads is 0.8 mm or less.

18. The method of claim 15, wherein a second capture pad of the plurality of second capture pads comprises a square surface having a width of between 1.2 mm and 2.0 mm.

19. The method of claim 15, wherein a second capture pad of the plurality of second capture pads comprises a rectangular surface, wherein the smaller of the length and the width of the rectangular surface is between 1.2 mm and 2.0 mm.

* * * * *